United States Patent [19]

Sakaguchi

[11] Patent Number: 5,949,798
[45] Date of Patent: Sep. 7, 1999

[54] INTEGRATED CIRCUIT FAULT TESTING SYSTEM BASED ON POWER SPECTRUM ANALYSIS OF POWER SUPPLY CURRENT

[75] Inventor: Kazuhiro Sakaguchi, Tokyo, Japan

[73] Assignee: NEC Corporation, Tokyo, Japan

[21] Appl. No.: 08/795,354

[22] Filed: Feb. 4, 1997

[30] Foreign Application Priority Data

Feb. 6, 1996 [JP] Japan .................... 8-044272

[51] Int. Cl.$^6$ ................ G01R 31/28; G11C 29/00
[52] U.S. Cl. .................... 371/27.1; 371/21.4
[58] Field of Search ................ 371/27.1, 27.2, 371/27.3, 27.4, 27.5, 21.4, 21.1, 21.2, 22.1; 324/158 R

[56] References Cited

U.S. PATENT DOCUMENTS

| | | | |
|---|---|---|---|
| 4,608,690 | 8/1986 | Judge | 371/21.1 |
| 4,849,847 | 7/1989 | McIver et al. | 371/25.1 |
| 4,855,670 | 8/1989 | Green | 324/158.1 |
| 5,117,130 | 5/1992 | Shoji | 307/443 |
| 5,321,354 | 6/1994 | Ooshima et al. | 324/158 R |
| 5,420,522 | 5/1995 | Smayling | 324/765 |
| 5,475,694 | 12/1995 | Ivanov et al. | 371/22.4 |
| 5,483,170 | 1/1996 | Beasley et al. | 365/49 |
| 5,491,665 | 2/1996 | Sachdev | 365/201 |

FOREIGN PATENT DOCUMENTS

| | | |
|---|---|---|
| 2302677 | 12/1990 | Japan . |
| 5273298 | 10/1993 | Japan . |
| 6160487 | 6/1994 | Japan . |
| 7280880 | 10/1995 | Japan . |

*Primary Examiner*—Hoa T. Nguyen
*Attorney, Agent, or Firm*—Whitham, Curtis & Whitham

[57] ABSTRACT

Quick detection of CMOS integrated circuit troubles with a simple system is realized. A tester repeatedly applies a test pattern to a CMOS integrated circuit under test, and a power supply unit supplies current through a current detection unit to the CMOS integrated circuit. The current detection unit outputs a detection signal, which is coupled through an amplifier to a power spectrum analyzing unit to derive its power spectrum. When the CMOS integrated circuit has a trouble, a quiescent supply current which is set apart from the transistor switching current is caused in specific sub-patterns in the test pattern for every $(NT+T_0)$ seconds. A checking unit detects the power of the detection signal in the neighborhood of $1/(NT+T_0)$ [Hz] and thus checks for a quiescent current, i.e., checks for a trouble in the CMOS integrated circuit under test.

19 Claims, 9 Drawing Sheets

INTEGRATED CIRCUIT FAULT TESTING SYSTEM BASED ON POWER SPECTRUM ANALYSIS OF POWER SUPPLY CURRENT

BACKGROUND OF THE INVENTION

The present invention relates to systems for detecting troubles in CMOS integrated circuits and, more particularly, to methods and systems for detecting troubles in CMOS integrated circuits on the basis of power supply current information.

Such CMOS integrated circuit trouble detection methods and systems have heretofore been used for quickly checking the normal operation of CMOS integrated circuits.

In a CMOS integrated circuit, only a very slight leak current flows as the supply current except for transient currents in transistor switching operations. This character of the CMOS integrated circuit can be utilized to detect troubles therein. A trouble is detected on the basis of a large current, which is not the transistor switching current or the leak current.

FIG. 11 shows a prior art example of the trouble detection system. In this case, a supply voltage is supplied from a power supply 5' to a CMOS integrated circuit 4' under test to check for a trouble in the circuit from the magnitude of the supply current, which is measured in an ammeter 6'.

FIG. 12 shows another prior art example of the trouble detection system. In this case, a tester 1 applies a test pattern from a test pattern storage unit 3 to a CMOS integrated circuit 4 under test, and the supply current at this time is detected in a current detection unit 6. A checking unit 7 checks for a trouble in the circuit 4 from the result of the detection or observation.

FIG. 13 shows a method of current measurement carried out in an IC checking system for checking electric characteristics of ICs (integrated circuits) proposed in Japanese Laid-Open Patent Publication No. 2-302677. In this method, current is measured in a timed relation to a generated test pattern. Specifically, for accurate current measurement a test pattern 102 which is outputted from a test pattern generator, is utilized to generate a gate signal for controlling the measurement of the supply current 101 in synchronism to the test pattern.

In the CMOS integrated circuit trouble detection system as shown in FIG. 11, which is based on the current measurement, the supply current in the CMOS integrated circuit is measured in the inoperative state thereof. Therefore, it is not always possible to measure a supply current in the case of a trouble.

The case of FIG. 12 is the real-time measurement of the supply current by operating the CMOS integrated circuit using the tester. However, it takes a time to detect current. That is, the real-time supply current measurement substantially cannot be made depending on the CMOS integrated circuit under test; it cannot be made with, for instance, high frequency operation devices or the like.

The prior art method of current measurement is applied to a system of determining AC characteristics of the supply current in a CMOS integrated circuit in the operative state thereof. In the system, the CMOS integrated circuit is tested by applying test patterns thereto and measuring the supply current therein for each applied test pattern. The accurate measurement of the supply current, however, requires a high speed current measuring system, and it is difficult in a short period of time.

FIG. 14 illustrates conceivable measurement of a quiescent current 105 caused as the supply current which is not a transistor switching current in a CMOS integrated circuit. In this case, however, it is necessary to separate the quiescent current from the supply current 106 as the transistor switching current, but it is difficult to do so.

SUMMARY OF THE INVENTION

The present invention was made in view of the above problems, and it has an object of providing a method and a system for detecting troubles in a CMOS integrated circuit by making a short-time check for a quiescent current other than any transistor switching current, which is caused by the application of each test pattern to the CMOS integrated circuit.

According to one aspect of the present invention, there is provided a system of detecting troubles in CMOS integrated circuits by observing any quiescent current other than transistor switching current in a supply current caused in a CMOS integrated circuit when made operative by test pattern application comprising: means for repeatedly applying a test pattern to the CMOS integrated circuit under test; current detection means for detecting the supply current supplied to the CMOS integrated circuit; and means for deriving a power spectrum of the supply current detected by the current detection means; the CMOS integrated circuit under test being checked for a trouble based on the magnitude power in the supply current power spectrum for a predetermined frequency band.

According to another aspect of the present invention, there is provided a system of detecting troubles in CMOS integrated circuits by observing any quiescent current other than transistor switching current in a supply current caused in a CMOS integrated circuit when made operative by test pattern application, comprising: a tester for applying the test pattern to the CMOS integrated circuit under test; a test pattern storing means in which data of the test pattern is stored; a program storing means in which a program for controlling the driving of the tester is stored; a power supply unit for supplying power to the CMOS integrated circuit under test; a current detection unit for detecting the supply current supplied from the power supply unit to the CMOS integrated circuit under test; an amplifier for amplifying the detection signal from the current detection unit; a power spectrum analyzing means for deriving power of the amplified detection signal for each frequency band; and a checking means for detecting the magnitude of the power of the amplified detection signal after filtering for each frequency band and checking the CMOS integrated circuit for a trouble based on the magnitude of the detected power in a predetermined frequency band.

Other objects and features will be clarified from the following description with reference to attached drawings.

PREFERRED EMBODIMENTS OF THE INVENTION

Figure 3:
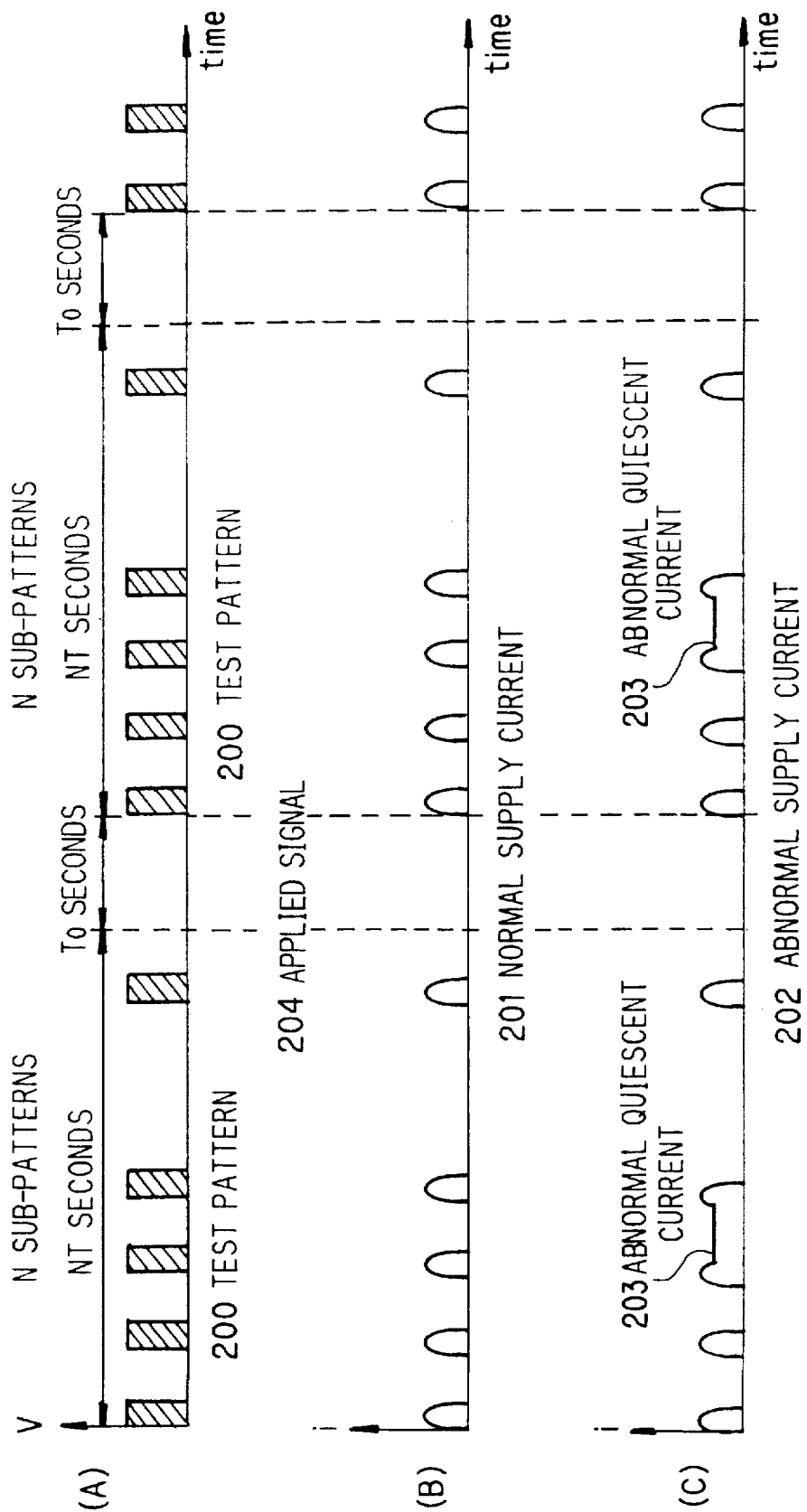
FIGS. 3(A)–3(C) are drawings representing relations between for the repetitive test pattern application and the supply current of CMOS integrated circuit for explaining a principle of the present invention.

FIG. 3(A) illustrates repetitive application of a test pattern 200 (applied signal 204) to a CMOS integrated circuit under test. The test pattern 200 consists of N sub-patterns, and its application requires NT seconds (T being its cycle period corresponding to the test cycle).

When the CMOS integrated circuit is operated by applying the applied signal 204 thereto, a normal supply current 201 is caused to flow through it, as shown in FIG. 3(B), when it is normal. This normal supply current is constituted by the sole transistor switching current, and the quiescent current level is ignorable.

When the CMOS integrated circuit under test has a trouble (for instance, a short-circuit), an abnormal supply current 202 is caused as shown in FIG. 3(C). This abnormal supply current 202 is an abnormal quiescent current 203 as VDD supply current quiescent Iddq in specific sub-patterns.

When the test pattern 200 is repeatedly applied to the CMOS integrated circuit under test in a cycle period of $(T+T_0)$ ($T_0$ being a time required for the system set-up, etc.), it is seen that the normal supply current 201 has a large peak at a frequency of $1/T$ |Hz|, while the abnormal supply current 202 has peaks at $1/T$ and $1/(NT+T_0)$ |Hz|. That is, the two currents are different as to whether they have a peak at $1/(NT+T_0)$ |Hz|.

It is thus possible to detect a quiescent current caused only in specific sub-patterns and thus determine a trouble in the CMOS integrated circuit under test by detecting the peak at $1/(NT+T_0)$ |Hz|.

This function can be realized without need of any high operation speed measuring instrument but with only a simple filtering mechanism.

The signal at $1/(NT+T_0)$ |Hz| may be dealt with in the case of a device which is high in the operation speed (i.e., short in T) as well. Since N is usually several thousands to several hundreds of thousands, the frequency of $1/(NT+T_0)$ |Hz| is not high and permits measurement without use of any special system.

Figure 1:
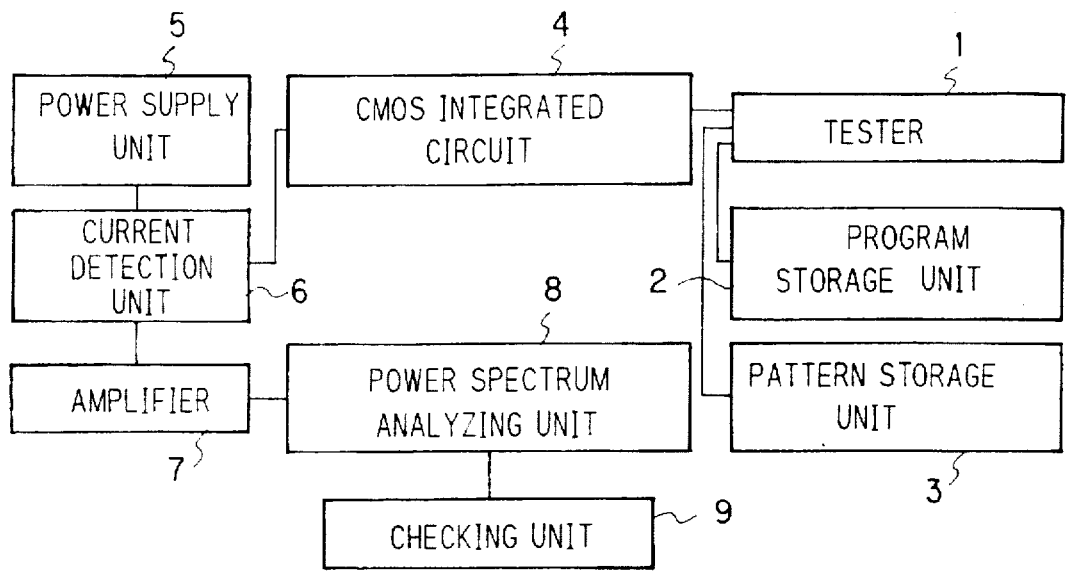
FIG. 1 is a block diagram showing a system according to a first embodiment of the present invention.

Preferred embodiments will be described hereinunder with reference to the drawings. FIG. 1 is a block diagram showing a system according to a first embodiment of the present invention.

Referring to FIG. 1, a CMOS integrated circuit 4 under test is electrically connected to a tester 1. A program storage unit 2 and a test pattern storage unit 3 are connected to the tester 1. A program for controlling the driving of the tester 1 (hereinafter referred to as "test program") is stored in the program storage unit 2, and test pattern data for testing the CMOS integrated circuit 4 under test is stored in the pattern storage unit 3. A power supply unit 5 is connected through a current detection unit 6 to the CMOS integrated circuit 4 for supplying power thereto. The tester 1 applies a test pattern, which is stored in the pattern storage unit 3, from a pin electronic card driver (not shown) to a corresponding terminal (or input pin) of the CMOS integrated circuit 4 with a test cycle, a repetition period and a signal waveform format as set by the program stored in the program storage unit 2 and under control of the program stored in the program storage unit 2. The power supply unit 5 may be as program controlled power supply unit which is provided in the tester 1.

The current detection unit 6 detects the supply current supplied from the power supply unit 5, and its detection signal is coupled through an amplifier 7 and a power spectrum analyzing unit 8 to a checking unit 9. The amplifier 7 amplifies the detection signal, and the power spectrum analyzing unit 8 determines the power of the amplified detection signal from the amplifier 7 for each frequency band. The checking unit 9 observes the determined signal power and checks for a trouble in the CMOS integrated circuit 4 under test on the basis of the magnitude of the observed signal power.

Figure 2:
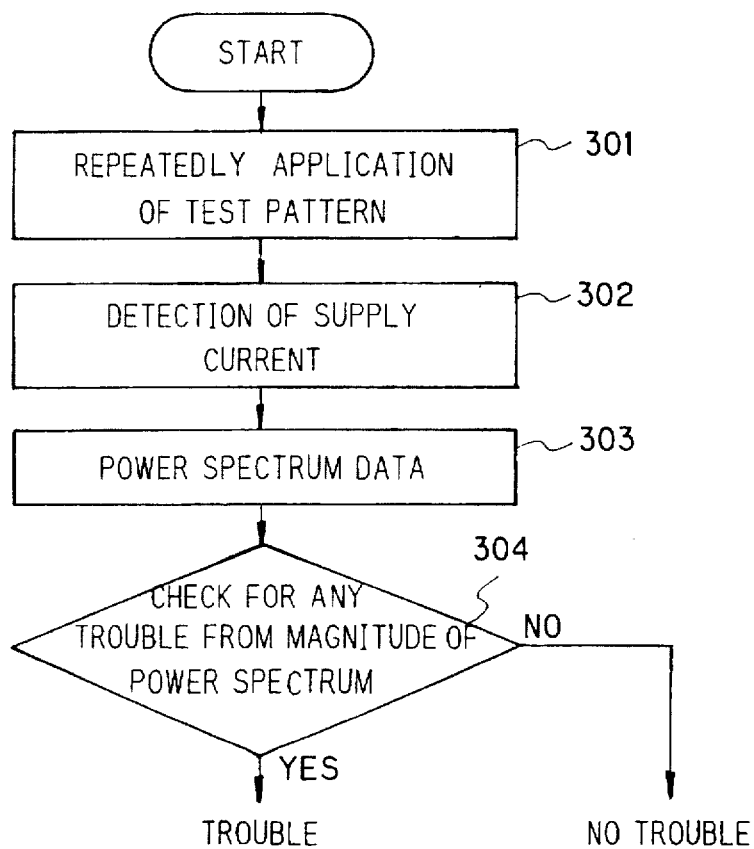
FIG. 2 is a flow chart illustrating an inspection routine according to the present invention.

A method of inspection using the system according to a first embodiment of the present invention will now be described. FIG. 2 is a flow chart illustrating an inspection routine according to the present invention. First, the test pattern is repeatedly applied from the tester to the CMOS integrated circuit under test (step 301). The cycle period of the sub-patterns of the test pattern is T seconds, and with N sub-patterns the repetition period of the test pattern is $(NT+T_0)$.

The detection or observed signal is then generated through detection of the supply current flowing in the CMOS integrated circuit under test (step 302). Power spectrum data of the supply current is then generated through filtering of the detection signal (step 303). A power spectrum at $1/(NT+T_0)$ |Hz| is then obtained from the power spectrum data, and the CMOS integrated circuit under test is checked for any trouble from the magnitude of the power spectrum thus obtained (step 304).

The operation of the system according to the first embodiment of the present invention shown in FIG. 1 will now be described. As described above, the program for driving the tester 1 is stored in the program storage unit 2, and the program pattern for testing the CMOS integrated circuit 4 under test is stored in the pattern storage unit 3. The tester 1 tests the CMOS integrated circuit 4 in accordance with the program and using the test pattern stored in the test pattern storage unit 3.

It is programmed that the test pattern is applied repeatedly to the CMOS integrated circuit 4. The test pattern, which consists of N sub-patterns each having a cycle period (or test period) of T seconds, requires NT seconds for its single application.

The test pattern is repeatedly applied to the CMOS integrated circuit 4 under test for every $(NT+T_0)$ seconds. The CMOS integrated circuit 4 is supplied with the power from the power supply unit 5, and the supply current is monitored by the current detection unit 6. The amplifier 7 amplifies the signal from the current detection unit 6, and the power spectrum analyzing unit 8 determines the power of the power spectrum for each frequency band. The checking unit 9 detects the magnitude of each frequency band power, and when the detected magnitude exceeds a reference value, it determines that a trouble is present in the CMOS integrated circuit.

Where the test pattern consists of N sub-patterns each with a cycle period of T seconds and its repetition period of the application to the CMOS integrated circuit 4 is $(NT+T_o)$ seconds, the checking unit 9 detects the magnitude of power in the neighborhood of $1/(NT+T_o)$ |Hz|.

Figure 4:
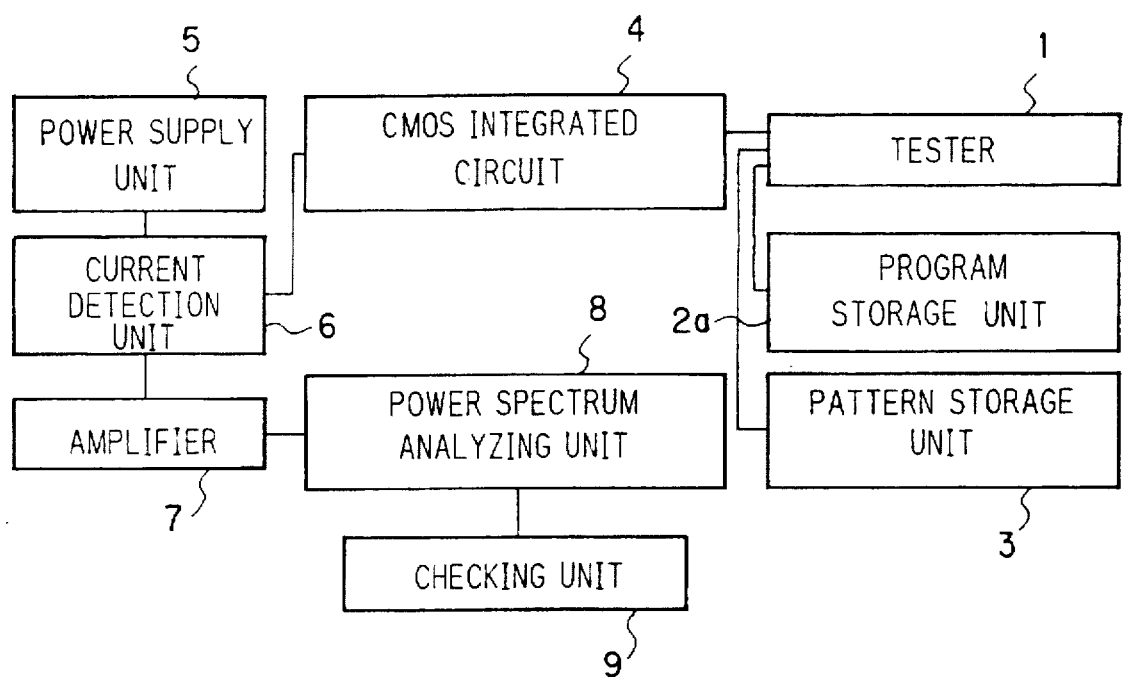
FIG. 4 is a block showing a different embodiment of the present invention.
Figure 5:
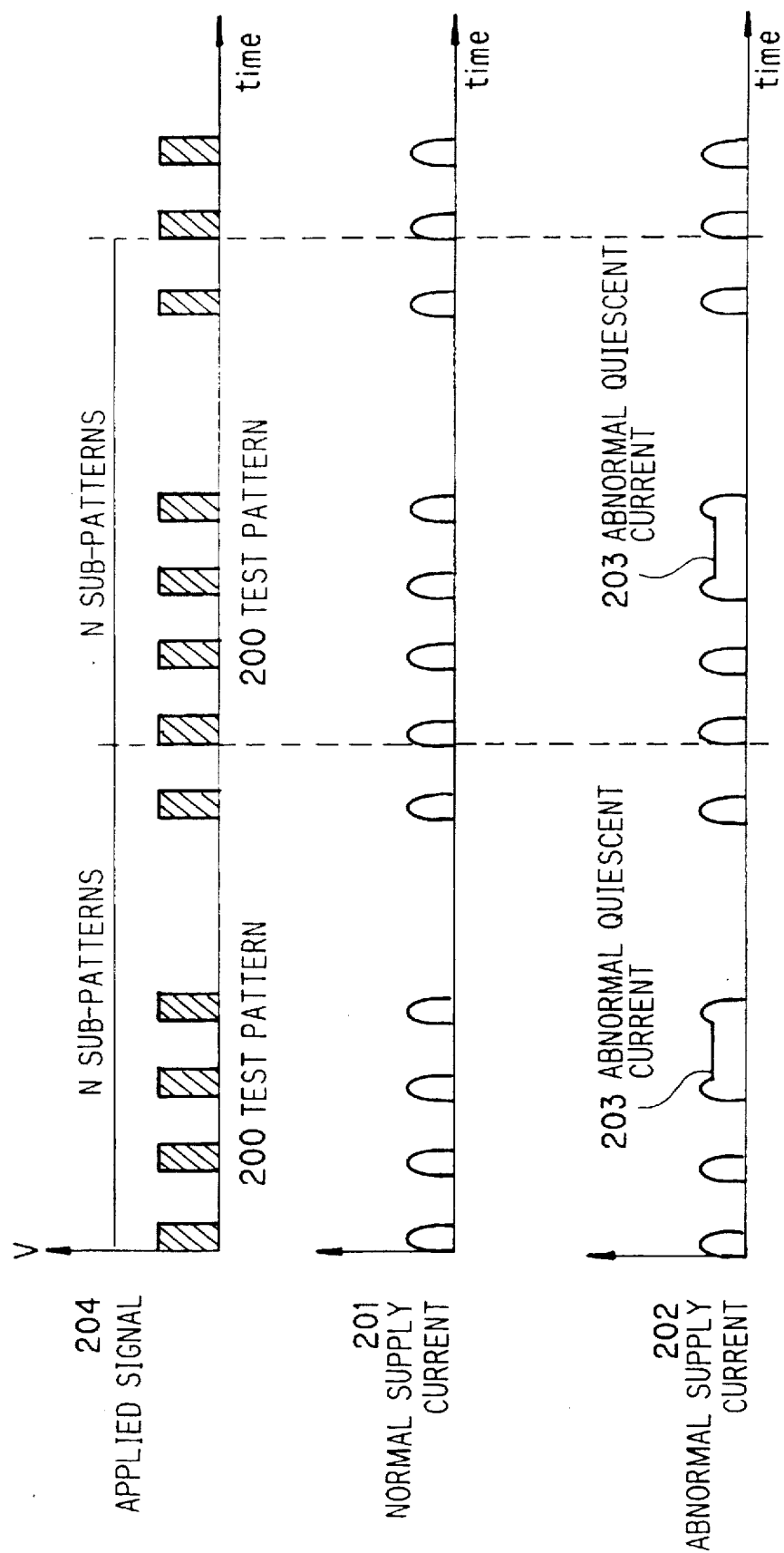
FIG. 5 is drawings representing relations between for the repetitive test pattern application and the supply current of CMOS integrated circuit.

FIG. 4 is a block showing a different embodiment of the present invention. In this embodiment, the time interval $T_o$ between adjacent test pattern periods NT is set to 0 seconds, as shown in FIG. 5. That is, a test pattern 200 consisting of N sub-patterns each with a cycle period of T seconds is repeatedly applied to the CMOS integral circuit 4 under test in a cycle period of NT seconds. The filter (i.e., power spectrum analyzing unit 8) selectively passes only a particular band, for instance the neighborhood of 1/NT |Hz| in the detection signal from the current detection unit 6. Since the test pattern is repeatedly and continuously applied to the CMOS integrated circuit 4 under test in the repetition cycle period of NT seconds, the supply current power spectrum contains no power spectrum due to $T_o$, and it is thus possible to permit more accurate inspection of the CMOS integrated circuit 4.

Figure 6:
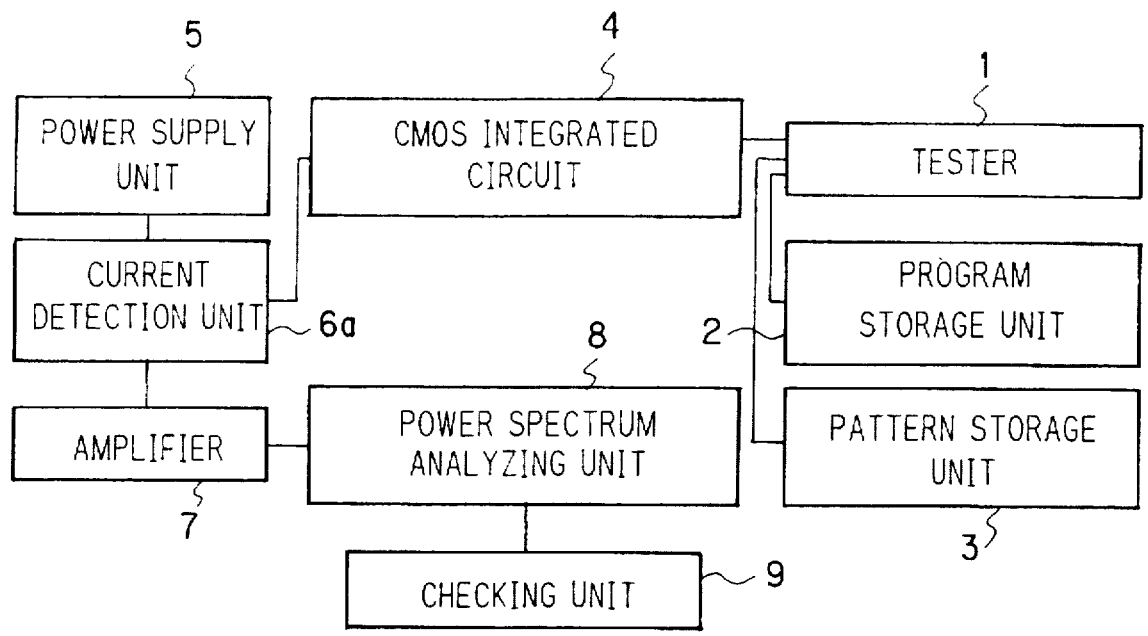
FIG. 6 is a block diagram showing a further embodiment of the present invention.
Figure 7:
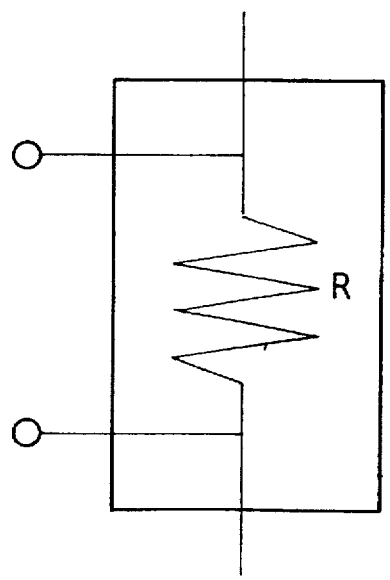
FIG. 7 shows the current detection unit 6a using a current detection resistor R.

FIG. 6 is a block diagram showing a further embodiment of the present invention. In this embodiment, the current detection unit 6a uses a current detection resistor R as shown in FIG. 7. By using the current detection resistor R it is possible to easily convert the current signal to the voltage signal.

Figure 8:
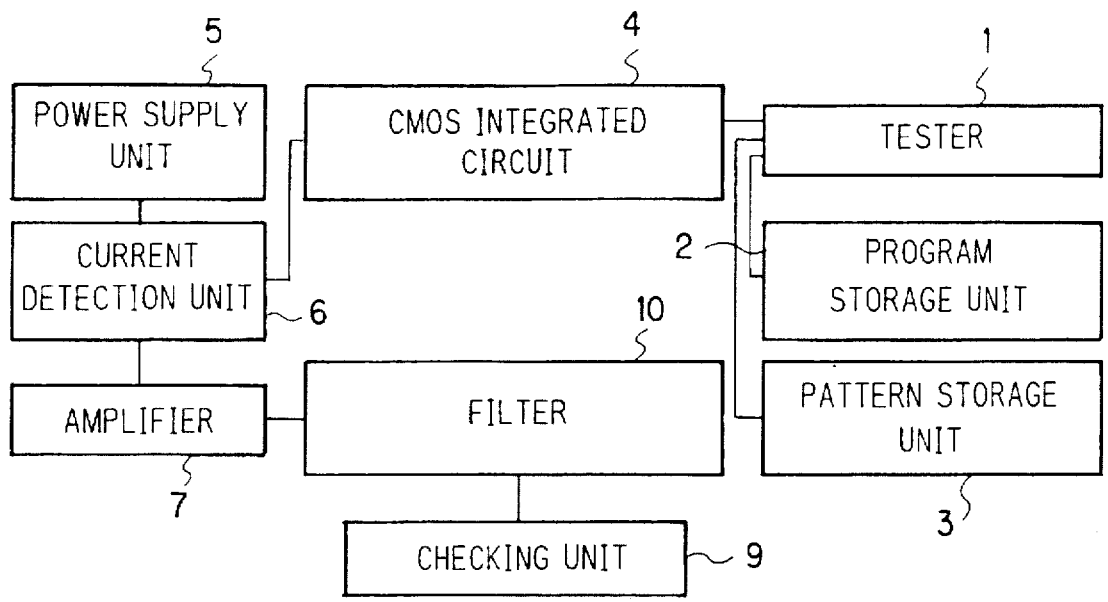
FIG. 8 is a block diagram showing a yet further embodiment of the present invention.

FIG. 8 is a block diagram showing a yet further embodiment of the present invention. In this embodiment, a filter 10 is used in lieu of the power spectrum analyzing unit 8 shown in FIG. 1. The filter 10 can pass a particular frequency part (signal) of the supply current data. The checking unit 9 checks for a trouble in the CMOS integrated circuit under test by detecting the power magnitude of the detection signal as the supply current data passed through the filter 10. With the filter 10 it is possible to detect the power magnitude of the supply current in a specific frequency band with a simple construction.

Figure 9:
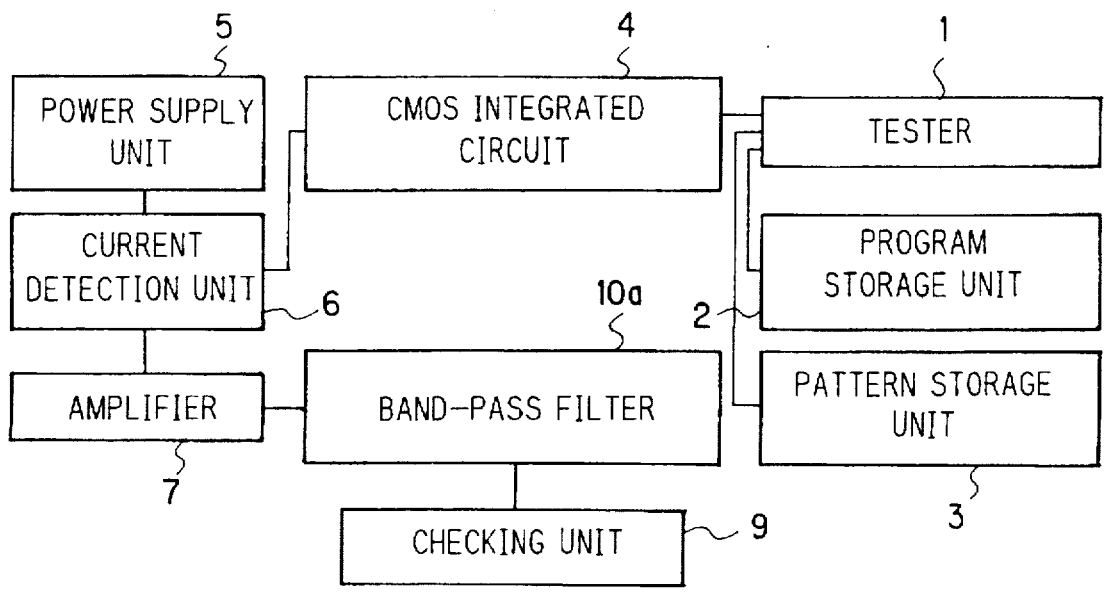
FIG. 9 is a block diagram showing a yet another embodiment of the present invention.

FIG. 9 is a block diagram showing a yet another embodiment of the present invention. In this embodiment, a band-pass filter 10a is used in place of the filter 10 in the preceding embodiment. Where the test pattern consists of N sub-patterns each with a cycle period of T seconds and is repeatedly applied to the CMOS integrated circuit 4 under test in a repetition cycle period of $(NT+T_o)$ seconds, the band-pass filter 10a passes only the neighborhood of $1/(NT+T_o)$ |Hz|. When an abnormal quiescent pattern is caused in specific sub-patterns due to a trouble in the CMOS integrated circuit 4 under test, the supply current power spectrum has a peak at $1/(NT+T_o)$ |Hz|, and this peak can be readily separated by the band-pass filter 10a.

Figure 10:
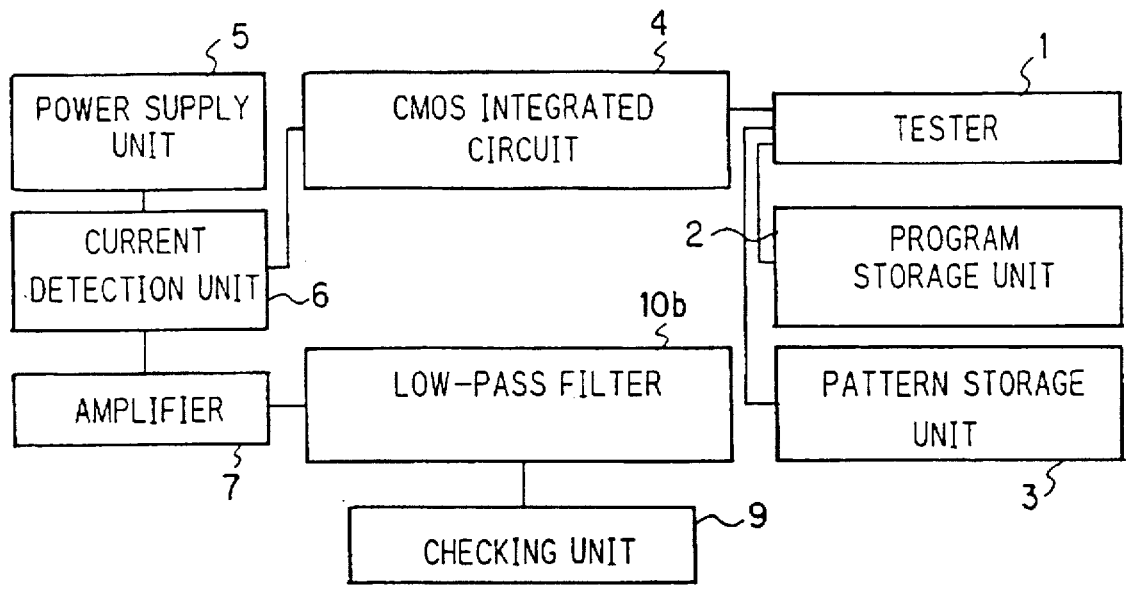
FIG. 10 shows a yet another embodiment of the present invention.
Figure 11:
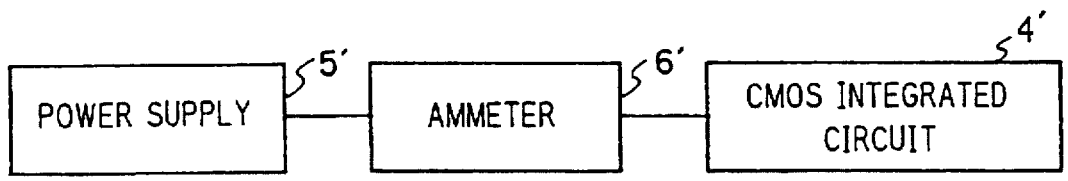
FIG. 11 shows a prior art example of the trouble detection system.
Figure 12:
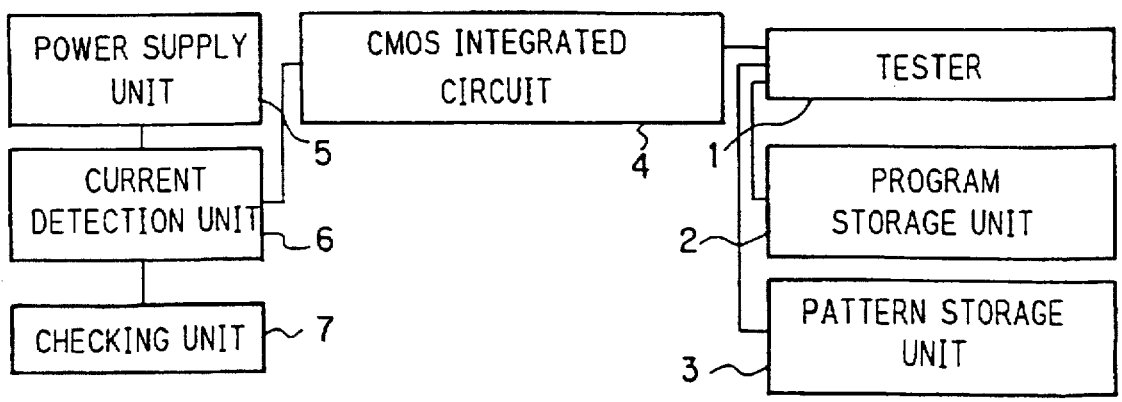
FIG. 12 shows another prior art example of the trouble detection system.
Figure 13:
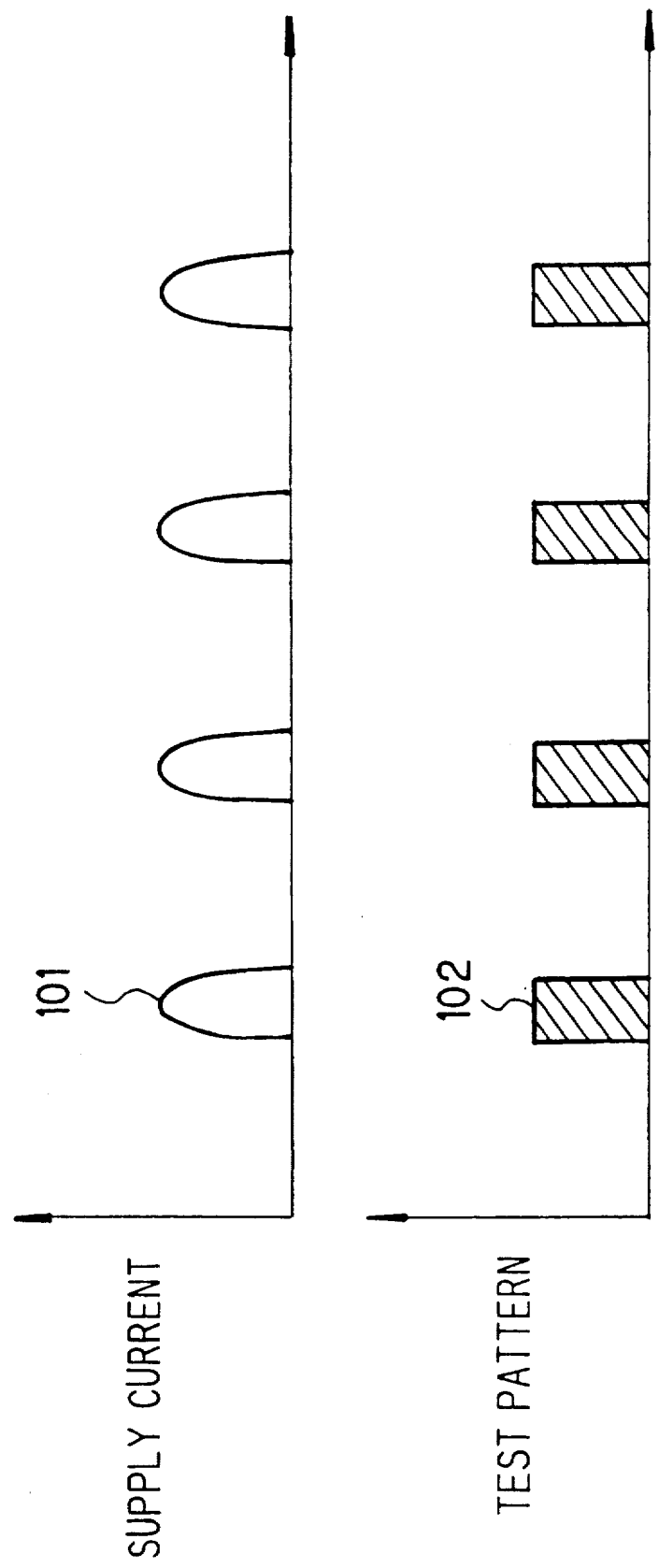
FIG. 13 shows a method of current measurement carried out in an IC checking system for checking electric characteristics of ICs.
Figure 14:
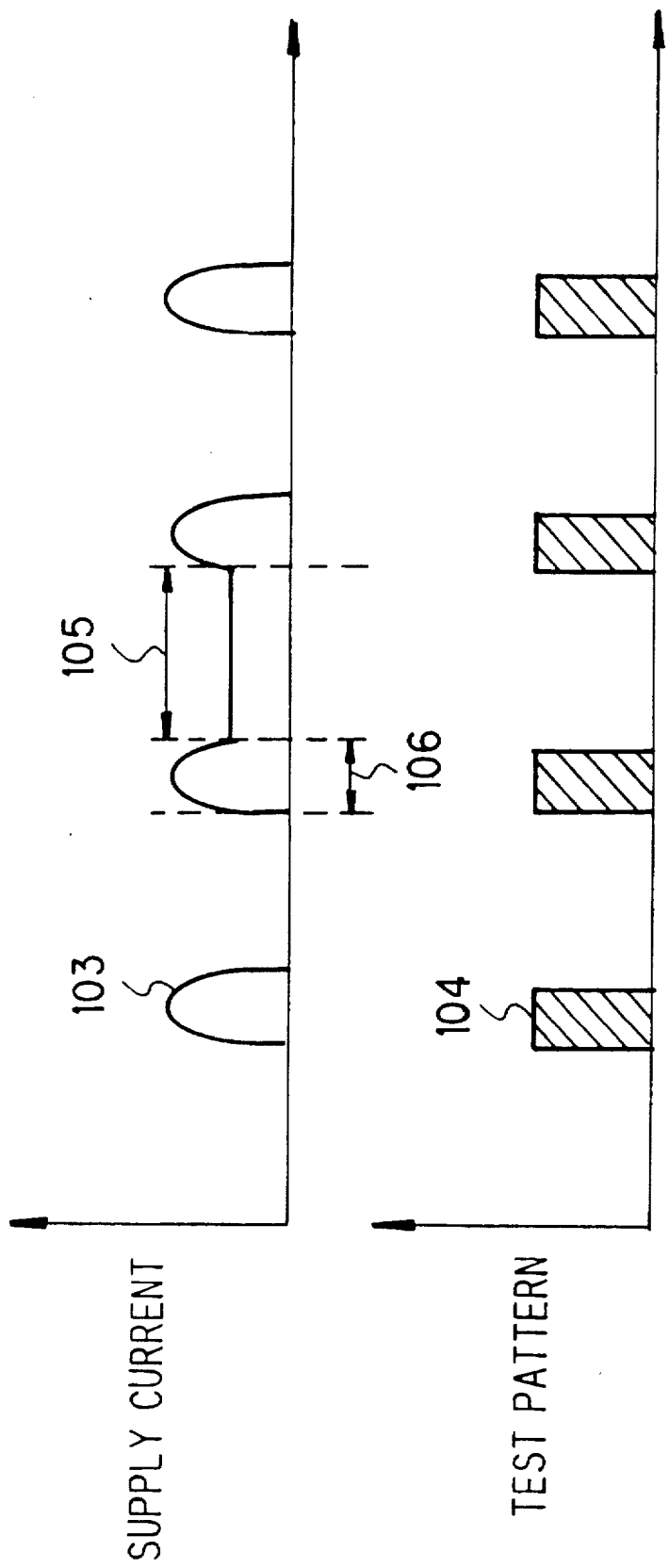
FIG. 14 illustrates conceivable measurement of a quiescent current 105 caused as the supply current which is not a transistor switching current in a CMOS integrated circuit.

FIG. 10 shows a yet another embodiment of the present invention. This embodiment uses a low-pass filter 10b in lieu of the filter 10 noted above. Where the test pattern consists of N sub-patterns each with a cycle period of T seconds and is repeatedly applied to the CMOS integrated circuit 4 in a repetition cycle period of $(NT+T_o)$ seconds, the low-pass filter 10b passes only a band below the neighborhood of $1/(NT+T_o)$ |Hz|. When an abnormal quiescent current is caused in specific sub-patterns due to a trouble in the CMOS integrated circuit 4 under test, the supply current power spectrum has a peak at $1/(NT+T_o)$ |Hz|, while no meaningful peak is present below $1/(NT+T_o)$ |Hz|. The low-pass filter 10b thus can readily separate the peak, while the system construction can be simplified.

As has been described in the foregoing, the system for detecting CMOS integrated circuit troubles according to the present invention can discriminate a quiescent signal, which is caused in a CMOS integrated circuit under test due to a trouble therein when a test pattern is applied thereto and is usually difficult to directly observe it, from the transistor switching current, that is, can check for such a quiescent current, through the supply current power spectrum analysis, because such quiescent current is caused in specific sub-patterns of the test pattern in every repetition application cycle thereof.

In addition, according to the present invention even in a test of a high operation speed device the discrimination of the quiescent current from the transistor switching current, can be very readily obtained by taking the length of the test pattern into considerations, and can be realized with a simple construction.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A system of detecting troubles in CMOS integrated circuits by observing any quiescent current other than a transistor switching current in a supply current caused in a CMOS integrated circuit when made operative by test pattern application, comprising:

means for repeatedly applying a test pattern to an input terminal of the CMOS integrated circuit under test which is not a supply terminal of said circuit under test, the test pattern including a series of sub-patterns spanning over a time period of said test pattern;

current detection means for detecting the supply current supplied to the CMOS integrated circuit;

means for deriving a power spectrum of the supply current detected by the current detection means, and means for checking the CMOS integrated circuit under test for a trouble based solely on a magnitude of power in the supply current power spectrum at a predetermined frequency.

2. The system of claim 1, wherein:

the test pattern includes N sub-patterns each having a cycle period of T seconds; and said checking means checks the CMOS integrated circuit under test for a trouble based on the magnitude of power in the supply current power spectrum at a predetermined frequency of $1/(NT+T_o)$(Hz), the supply current power spectrum being obtained from the CMOS integrated circuit by repeatedly applying the test pattern to the CMOS integrated circuit under test is a repetitive cycle period of $(NT+T_o)$ seconds.

3. The system of claim 1, wherein:

the test pattern includes N sub-patterns each having a cycle period of T seconds; and said checking means checking the CMOS integrated circuit under test for a trouble based on the magnitude of power in the supply current power spectrum at a predetermined frequency of $1/(NT+T_o)$(Hz), the supply current power spectrum being obtained from the CMOS integrated circuit by repeatedly applying the test pattern to the CMOS integrated circuit under test in a repetitive cycle period of TN seconds.

4. The system of claim 1, wherein said predetermined frequency corresponds to a time within said time period where a predetermined one of said sub-patterns occurs.

5. A method for detecting a fault in an integrated circuit, comprising steps of:

applying a test pattern to an input terminal of the integrated circuit which is not a power supply terminal, said test pattern being driven by a program stored in the memory unit and including a series of spaced sub-patterns spanning over a time period;

supplying power from a power supply unit to the integrated circuit;

detecting supply current supplied from the power supply unit to the integrated circuit, and forming a detection signal based on said supply current;

deriving power from the detection signal;

detecting a magnitude of the power for at least one of a plurality of frequency bands; and checking the integrated circuit for a fault condition based solely on the magnitude of the detected power in said at least one of a plurality of frequency bands.

6. The method of claim 5, wherein the test pattern includes N sub-patterns each with a cycle period of T seconds, and wherein said method further comprises:

applying the test pattern to the integrated circuit a predetermined number of times in a repetitive cycle period of $(TN+T_0)$ seconds; and wherein said predetermined frequency is $1/(NT+T_0)$.

7. The method of claim 5, wherein the test pattern includes N sub-patterns each with a cycle period of T seconds, and wherein said method further comprises:

applying the test pattern to the integrated circuit a predetermined number of times in a repetitive cycle period of $(TN+T_0)$ seconds; and wherein said predetermined frequency is $1/(NT)$.

8. The method of claim 5, wherein said integrated circuit is a CMOS integrated circuit.

9. The system of claim 5, wherein said step of checking includes checking the integrated circuit for a fault condition is based solely on the magnitude of the detected power at a predetermined frequency corresponding to a time within said time period where a predetermined one of said sub-patterns occurs.

10. A system of detecting troubles in CMOS integrated circuits by observing any quiescent current other than transistor switching current in a supply current caused in a CMOS integrated circuit when made operative by test pattern application, comprising:

a tester for applying the test pattern to the CMOS integrated circuit under test;

a test pattern storing means in which data of the test pattern is stored;

a program storing means in which a program for controlling the driving of the tester is stored;

a power supply unit for supplying power to the CMOS integrated circuit under test;

a current detection unit for detecting the supply current supplied from the power supply unit to the CMOS integrated circuit under test;

an amplifier for amplifying the detection signal from the current detection unit;

a power spectrum analyzing means for deriving power of the amplified detection signal for each frequency band; and a checking means for detecting the magnitude of the power of the amplified detection signal after filtering for each frequency band and checking the CMOS integrated circuit for a trouble based on the magnitude of the detected power in a predetermined frequency band.

11. The CMOS integrated circuit trouble detection system according to claim 10, wherein:

the test pattern consists of N sub-patterns each with a cycle period of T seconds;

the test pattern is repeatedly applied to the CMOS integrated circuit under test in a repetitive cycle period of $(TN+T_0)$ seconds; and the checking means checks the CMOS integrated circuit under test for a trouble based on the magnitude of power of the detection signal in the neighborhood of $1/(NT+T_0)$.

12. The CMOS integrated circuit trouble detection system according to claim 11, wherein the current detection unit includes a current detection resistor.

13. The CMOS integrated circuit trouble detection system according to claim 10, wherein:

the test pattern consists of N sub-patterns each with a cycle period of T seconds;

the test pattern is repeatedly applied to the CMOS integrated circuit under test in a repetitive cycle period of TN seconds; and the checking means checks the CMOS integrated circuit under test for a trouble based on the magnitude of power of the detection signal in the neighborhood of $1/(NT)$.

14. The CMOS integrated circuit trouble detection system according to claim 13, wherein the current detection unit includes a current detection resistor.

15. The CMOS integrated circuit trouble detection system according to claim 10, wherein the current detection unit includes a current detection resistor.

16. The CMOS integrated circuit trouble detection system according to claim 10, wherein:

in lieu of the power spectrum analyzing means a band-pass filter for passing only a predetermined frequency band is used; and the checking means checks the CMOS integrated circuit under test for a trouble based on power of the detection signal having passed through the band-pass filter.

17. The CMOS integrated circuit trouble detection system according to claim 10, wherein:

the test pattern consists of N sub-patterns each with a cycle period of T seconds and is repeatedly applied to the CMOS integrated circuit under test in a repetitive application cycle time of $(NT+T_0)$ seconds; and the band-pass filter passes only a frequency band in the neighborhood of $1/(NT+T_0)$.

18. The CMOS integrated circuit trouble detection system according to claim 10, wherein:

in lieu of the power spectrum analyzing means a low-pass filter for passing only a band below a predetermined frequency is used; and the checking means checks the CMOS integrated circuit under test for a trouble according to power of the detection signal having passed through the low-pass filter.

19. The CMOS integrated circuit trouble detection system according to claim 18, wherein:

the test pattern consists of N sub-patterns each with a cycle period of T seconds and is repeatedly applied to the CMOS integrated circuit under test in a repetitive application cycle time of $(NT+T_0)$ seconds; and the band-pass filter passes only a frequency band in the neighborhood of $1/(NT+T_0)$.

* * * * *